United States Patent
Ko

(10) Patent No.: US 10,126,375 B2
(45) Date of Patent: Nov. 13, 2018

(54) DIAGNOSIS CIRCUIT AND METHOD FOR A POWER MODULE

(71) Applicant: INDUSTRIAL TECHNOLOGY RESEARCH INSTITUTE, Hsin-Chu (TW)

(72) Inventor: Chih-Wei Ko, Taichung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/391,474

(22) Filed: Dec. 27, 2016

(65) Prior Publication Data

US 2018/0149712 A1  May 31, 2018

(30) Foreign Application Priority Data

Nov. 25, 2016 (TW) .............................. 105138940 A

(51) Int. Cl.
*G01R 31/42* (2006.01)
*G01R 1/30* (2006.01)
(Continued)

(52) U.S. Cl.
CPC .............. *G01R 31/42* (2013.01); *G01R 1/30* (2013.01); *H02M 1/32* (2013.01); *H02M 7/5387* (2013.01); *H03K 17/082* (2013.01)

(58) Field of Classification Search
CPC ............ G01R 31/42; G01R 1/30; H02M 1/32
See application file for complete search history.

(56) References Cited

U.S. PATENT DOCUMENTS 4,152,758 A * 5/1979 Bailey ..................... H02P 7/293
                                                          318/778
5,687,049 A   11/1997 Mangtani
(Continued)

FOREIGN PATENT DOCUMENTS

CN   101078747 A   11/2007
CN   102053210 A    5/2011
(Continued)

OTHER PUBLICATIONS

Fang et al., "Online Inverter Fault Diagnosis of Buck-Converter BLDC Motor Combinations," IEEE Transactions on Power Electronics, vol. 30, No. 5, May 2015 (date of publication Jun. 12, 2014), pp. 2674-2688.
(Continued)

*Primary Examiner* — Son Le
*Assistant Examiner* — Akm Zakaria
(74) *Attorney, Agent, or Firm* — Birch, Stewart, Kolasch & Birch, LLP

(57) ABSTRACT

A diagnosis circuit comprises: a logic circuit, wherein the logic circuit comprises a set having a gate voltage terminal of an arm of a phase logical OR a dead time voltage terminal, and the set logical XOR a drain-source voltage terminal of another arm of the phase; a filter circuit coupled to the logic circuit, wherein the filter circuit is configured to filter transient noises; a comparison circuit coupled to the filter circuit, wherein the comparison circuit is configured to determine whether a phase current of a phase current terminal of the phase is greater than zero; and a latch coupled to the comparison circuit, wherein the latch is configured to store diagnosis signals temporarily.

21 Claims, 11 Drawing Sheets

(51) Int. Cl.
*H02M 1/32* (2007.01)
*H02M 7/5387* (2007.01)
*H03K 17/082* (2006.01)

(56) References Cited

U.S. PATENT DOCUMENTS

| | | | |
|---|---|---|---|
| 6,949,980 B2 * | 9/2005 | Jouen | H03L 7/0891 331/1 A |
| 7,449,854 B2 | 11/2008 | Tsubota | |
| 8,054,026 B2 | 11/2011 | Shimana et al. | |
| 8,645,087 B2 | 2/2014 | Doktar et al. | |
| 2012/0181961 A1 * | 7/2012 | Kono | B60L 3/003 318/400.21 |
| 2014/0347067 A1 | 11/2014 | Hirono | |
| 2015/0162821 A1 * | 6/2015 | Wu | H02M 1/4225 363/21.17 |
| 2016/0294298 A1 * | 10/2016 | Wong | H02M 3/33592 |

FOREIGN PATENT DOCUMENTS

| | | |
|---|---|---|
| CN | 101615857 B | 7/2012 |
| CN | 103744013 B | 6/2016 |
| CN | 105765852 A | 7/2016 |
| TW | 200912329 A | 3/2009 |
| TW | I519052 B | 1/2016 |
| TW | I551872 B | 10/2016 |

OTHER PUBLICATIONS

Khomfoi et al., "Fault Detection and Reconfiguration Technique for Cascaded H-bridge 11-level Inverter Drives Operating under Faulty Condition," PEDS, 2007, pp. 1035-1042.

Sim et al., "A Detection Method for an Open-Switch Fault in Cascaded H-bridge Multilevel Inverters," IEEE, 2014, pp. 2101-2106.

Sim et al., "Using assymetric zero-voltage switching states Detecting Open-Switch Faults," IEEE Industry Applications Magazine, Mar.-Apr. 2016 (Date of publication Jan. 8, 2016), pp. 27-37.

Trabelsi et at., "Multiple IGBTs Open Circuit Faults Diagnosis in Voltage Source Inverter Fed Induction Motor Using Modified Slope Method," XIX International Conference on Electrical Machines—ICEM, Rome, 2010, 6 pages.

Yong et al., "IGBT Open Circuit Fault Diagnosis in VSI Fed Induction Motor Drives Based on Modified Average Current Method," IEEE 9th Conference on Industrial Electronics and Applications (ICIEA), 2014, pp. 1334-1338.

Taiwanese Office Action and Search Report, dated Dec. 14, 2017, for Taiwanese Application No. 105138940.

* cited by examiner

US 10,126,375 B2

DIAGNOSIS CIRCUIT AND METHOD FOR A POWER MODULE

CROSS REFERENCE TO RELATED APPLICATION

This application claims the priority benefits of Taiwan application No. 105138940, entitled "DIAGNOSIS CIRCUIT AND METHOD FOR A POWER MODULE", and filed in the Taiwan Intellectual Property Office on Nov. 25, 2016. The entirety of which is incorporated by reference herein.

TECHNICAL FIELD

The disclosure relates to a diagnosis circuit and a diagnosis method for a power module.

BACKGROUND

A variable frequency controller has circuit characteristics of a three-phase-six-arm circuit. If a power switch of the three-phase-six-arm circuit fails, an arm may be open or short so that the three-phase-six-arm circuit may not operate normally. In a failure state of a power module, a large current caused by a short circuit of an up arm or a down arm may be generated. The large current damages the power module and causes the variable frequency controller output abnormally. For example, if the up arm is short and the down arm still works normally, an over-current will be generated.

When the power module is damaged, the output power will be abnormal. If the diagnosis time is too long, the power module will be lead to a second damage, which causes the overall system being at risk. If the time of the failure state is reduced, a possibility of the second damage may be reduced.

SUMMARY

The present disclosure provides a diagnosis circuit for a power module. The diagnosis circuit comprises: a logic circuit, wherein the logic circuit comprises a set having a gate voltage terminal of an arm of a phase logical OR a dead time voltage terminal, and the set logical XOR a drain-source voltage terminal of another arm of the phase; a filter circuit coupled to the logic circuit, wherein the filter circuit is configured to filter transient noises; a comparison circuit coupled to the filter circuit, wherein the comparison circuit is configured to determine whether a phase current of a phase current terminal of the phase is greater than zero; and a latch coupled to the comparison circuit, wherein the latch is configured to store diagnosis signals temporarily.

The present disclosure provides a diagnosis circuit for a power module. The diagnosis circuit comprises: a logic circuit, wherein a drain-source voltage terminal of an arm of a phase logical XOR a drain-source voltage terminal of another arm of the phase; a filter circuit coupled to the logic circuit, wherein the filter circuit is configured to filter transient noises; and a latch coupled to the filter circuit, wherein the latch is configured to store diagnosis signals temporarily.

The present disclosure provides a diagnosis method for a power module. The diagnosis method comprises: inputting a voltage to six arms; receiving a drain-source voltage and a gate voltage of each arm of the six arms; receiving a phase current of each phase of three phases of the six arms; determining whether the phase current is greater than zero; and determining a set having the gate voltage of one of the arms of the phase logical OR a dead time voltage, and whether the set and the drain-source voltage of another arm of the phase are in phase.

DETAILED DESCRIPTION OF DISCLOSED EMBODIMENTS

The present disclosure provides a diagnosis circuit and a diagnosis method for a power module. In the diagnosis circuit and the diagnosis method, feedback signals of gate voltages, drain-source voltages, and phase currents of power switches are fed back and retrieved. By using the feedback signals, the diagnosis circuit on-line detects whether a power module operates normally or not. When the power module fails, the diagnosis circuit rapidly determines whether the power module is damaged or not so as to reduce the failure time of the power module. Therefore, a second damage on the power module may be prevented.

Figure 1:
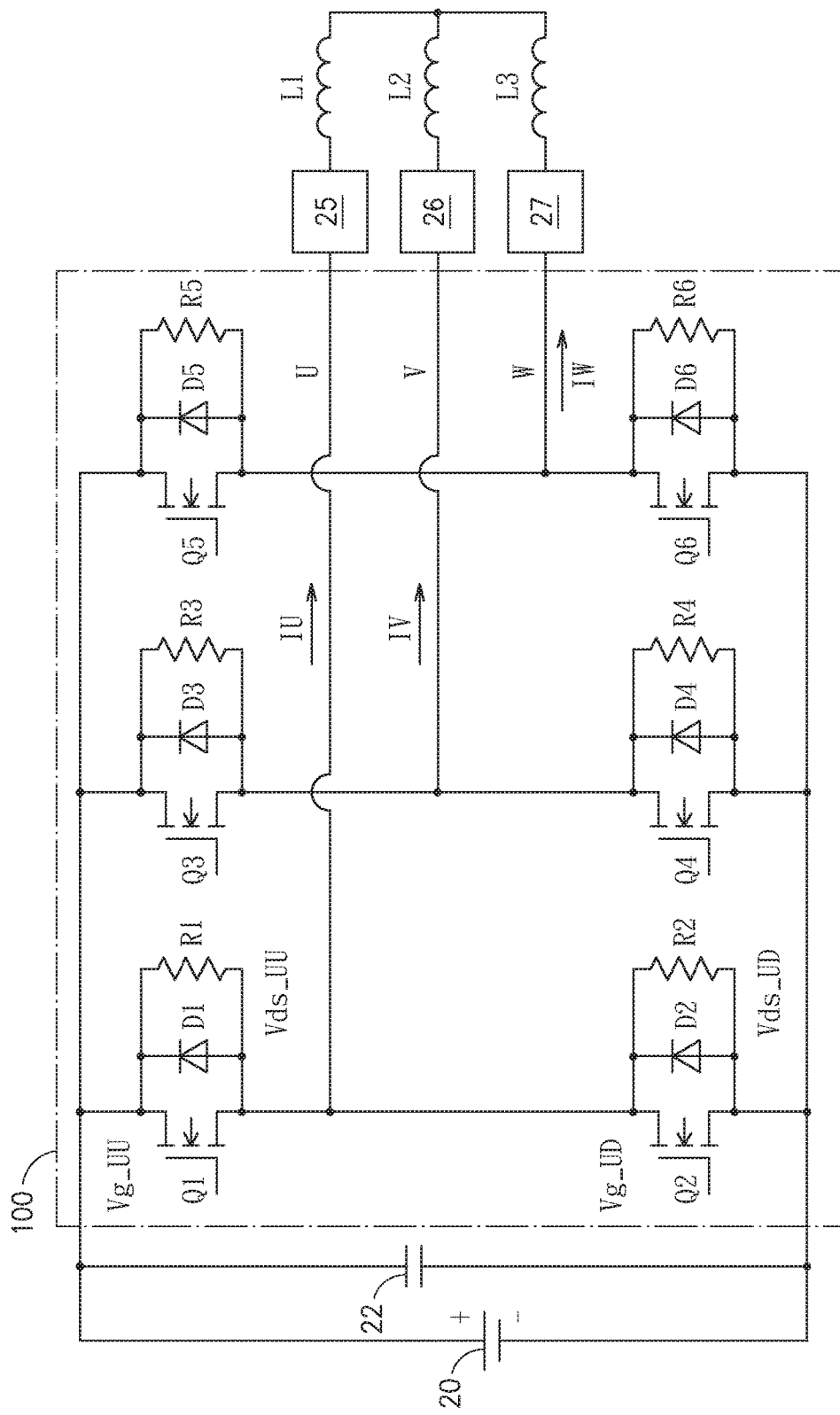
FIG. 1 is a diagram illustrating a power module in accordance with an embodiment of the present disclosure.

FIG. 1 is a diagram illustrating a power module 100 in accordance with an embodiment of the present disclosure. The power module 100 is a part of a variable frequency controller. The power module 100 has circuit characteristics of a three-phase-six-arm circuit. The power module 100 is applicable to motors or high power electric machines. The power module 100 comprises power switches Q1, Q2, Q3, Q4, Q5, and Q6, diodes D1, D2, D3, D4, D5, and D6. The power switch Q1 connects to the power switch Q2 in series. A combination of the power switches Q1 and Q2 is referred to as a U-phase. The power switch Q1 represents an up arm, and the power switch Q2 represents a down arm. The power switch Q3 connects to the power switch Q4 in series. A combination of the power switches Q3 and Q4 is referred to as a V-phase. The power switch Q3 represents an up arm, and the power switch Q4 represents a down arm. The power switch Q5 connects to the power switch Q6 in series. A combination of the power switches Q5 and Q6 is referred to as a W-phase. The power switch Q5 represents an up arm, and the power switch Q6 represents a down arm. The power switches Q1, Q2, Q3, Q4, Q5, and Q6 may be suitable power transistors or power components such as power metal oxide semiconductor field-effect transistors (power MOSFET). The power module 100 is coupled to a battery 20, and the power module 100 connects to a capacitor 22 in parallel. A current transducer 25 connects to a node between the power switches Q1 and Q2. The current transducer 25 detects a phase current IU of the U-phase. A current transducer 26 connects to a node between the power switches Q3 and Q4. The current transducer 26 detects a phase current IV of the V-phase. A current transducer 27 connects to a node between the power switches Q5 and Q6. The current transducer 27 detects a phase current IW of the W-phase. The current transducer 25 connects to an inductor L1. The current transducer 26 connects to an inductor L2. The current transducer 27 connects to an inductor L3.

In an embodiment, resistors R1, R2, R3, R4, R5, and R6 are respectively equipped across the power switches Q1, Q2, Q3, Q4, Q5, and Q6. In detailed, each of the resistors R1-R6 bridges between a drain terminal and a source terminal of each of the power switches Q1-Q6. A voltage difference between two ends of each of the resistors R1-R6 is equivalent to a voltage difference between a drain terminal and a source terminal of each of the power switches Q1-Q6.

Figure 2:
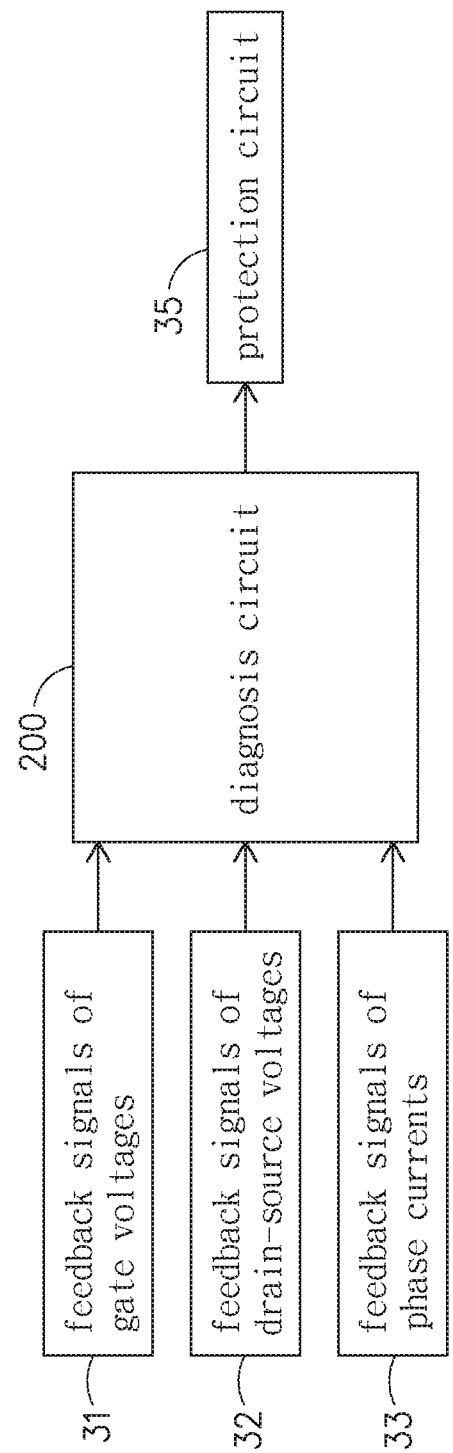
FIG. 2 is a framework diagram illustrating a diagnosis circuit in accordance with an embodiment of the present disclosure.

FIG. 2 is a framework diagram illustrating a diagnosis circuit 200 in accordance with an embodiment of the present disclosure. The diagnosis circuit 200 is configured to diagnose whether the power module 100 fails. The diagnosis circuit 200 receives feedback signals of gate voltages of six arms (step 31), feedback signals of drain-source voltages of the six arms (step 32), and feedback signals of phase currents of three phases of the six arms (step 33). The feedback signals of the gate voltages of the six arms are referred to as the gate voltages of the power switches Q1-Q6. The feedback signals of drain-source voltages of the six arms are referred to as drain-source voltages of the power switches Q1-Q6 respectively. The feedback signals of the phase currents of the three phases are referred to as phase currents IU, IV, and IW captured by the current transducers 25, 26, and 27 respectively. The judgment result of the diagnosis circuit 200 is transmitted to a protection circuit 35. If the diagnosis circuit 200 determines that the power module 100 has failed, the protection circuit 35 is activated.

Figure 3:
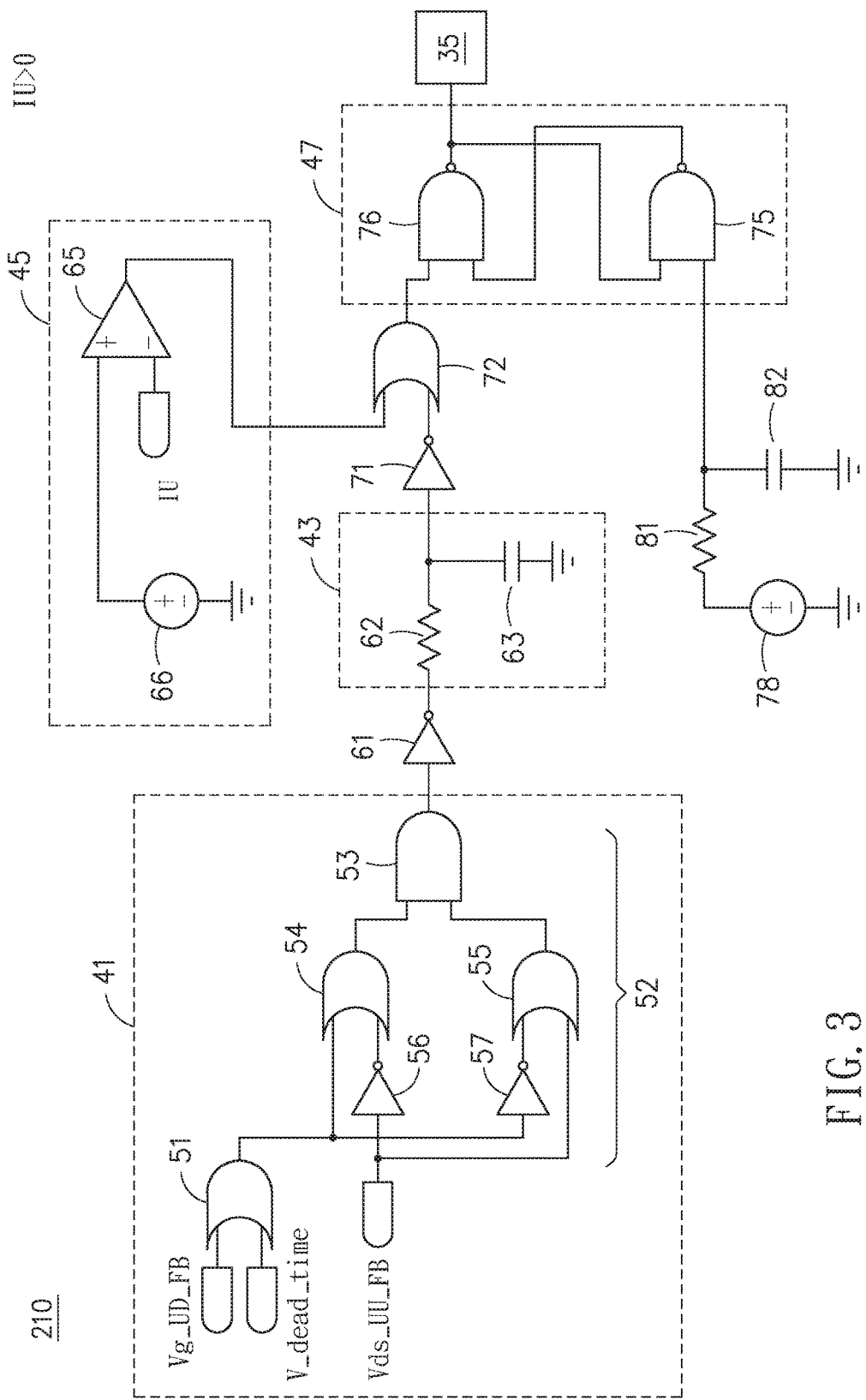
FIG. 3 is a circuit diagram illustrating a diagnosis circuit in accordance with an embodiment of the present disclosure.

FIG. 3 is a circuit diagram illustrating a diagnosis circuit 210 in accordance with an embodiment of the present disclosure. The U-phase, V-phase, and W-phase are respectively equipped with one diagnosis circuit 210, and the operating timing of the diagnosis circuit 210 at each of the three phases is the timing that a corresponding phase current of the phase is greater than zero. In an embodiment of taking the U-phase as an example, the diagnosis circuit 210 is arranged on the U-phase (the combination of the power switches Q1 and Q2). When the phase current IU of the U-phase is greater than zero, the diagnosis circuit 210 will operate. The diagnosis circuit 210 comprises: a logic circuit 41, wherein the logic circuit 41 comprises a set having a gate voltage Vg_UD_FB terminal of an arm (a down arm, the power switch Q2 in FIG. 1) of a phase (the U-phase) logical OR a dead time voltage V_dead_time terminal, and the set logical exclusive-OR (XOR) a drain-source voltage Vds_UU_FB terminal of another arm (an up arm, the power switch Q1 in FIG. 1) of the phase (the U-phase); a filter circuit 43 coupled to the logic circuit 41, wherein the filter circuit 43 is configured to filter transient noises; a comparison circuit 45 coupled to the filter circuit 43, wherein the comparison circuit 45 is configured to determine whether the phase current IU of the phase current IU terminal of the phase (the U-phase) is greater than zero; and a latch 47 coupled to the comparison circuit 45, wherein the latch 47 is configured to store diagnosis signals temporarily. The gate voltage Vg_UD_FB (FIG. 3) is derived from the gate voltage Vg_UD (FIG. 1) by dropping the gate voltage Vg_UD. The drain-source voltage Vds_UU_FB (FIG. 3) is derived from the drain-source voltage Vds_UU (FIG. 1) by dropping the drain-source voltage Vds_UU.

In an embodiment, the logic circuit 41 further comprises an OR gate 51, wherein an input terminal of the OR gate 51 is coupled to the gate voltage Vg_UD_FB terminal. The gate voltage Vg_UD_FB (FIG. 3) is derived from the gate voltage Vg_UD (FIG. 1) by dropping the gate voltage Vg_UD. Another input terminal of the OR gate 51 connects to the dead time voltage V_dead_time terminal. In an embodiment, the logic circuit 41 comprises a XOR gate 52, wherein an input terminal of the XOR gate 52 connects to an output terminal of the OR gate 51, and another input terminal of the XOR gate 52 connects to the drain-source voltage Vds_UU_FB terminal. The XOR gate 52 is composed of an AND gate 53, two OR gates 54 and 55, and two diodes 56 and 57.

In an embodiment, a diode 61 is located between the logic circuit 41 and the filter circuit 43. An anode of the diode 61 connects to an output terminal of the logic circuit 41, and a cathode of the diode 61 connects to an input terminal of the filter circuit 43.

In an embodiment, the filter circuit 43 comprises a resistor 62; and a capacitor 63, wherein an end of the capacitor 63 is grounded, another end of the capacitor 63 connects to the resistor 62. The filter circuit 43 is configured to filter transient noises.

In an embodiment, the comparison circuit 45 further comprises an operational amplifier 65. An inverting input terminal V− of the operational amplifier 65 connects to the phase current IU terminal. A non-inverting input terminal V+ of the operational amplifier 65 connects to a system voltage terminal 66 or a constant voltage. The comparison circuit 45 is configured to decide whether the diagnosis circuit 210 shall work or not. When the phase current IU is greater than zero, the diagnosis circuit 210 will work. On the contrary, when the phase current IU is less than zero, the diagnosis circuit 210 will rest.

In an embodiment, the diagnosis circuit 210 further comprises a diode 71. The diode 71 is located between an OR gate 72 and the filter circuit 43. An anode of the diode 71 connects to an output terminal of the filter circuit 43, and a cathode of the diode 71 connects to an input terminal of the OR gate 72.

In an embodiment, the diagnosis circuit 210 further comprises an OR gate 72, wherein an input terminal of the OR gate 72 connects to an output terminal of the comparison circuit 45 (that is, an output terminal of the operational amplifier 65). Another input terminal of the OR gate 72 is coupled to an output terminal of the filter circuit 43, and an output terminal of the OR gate 72 connects to the latch 47.

In an embodiment, the diagnosis circuit 210 further comprises the latch 47. The latch 47 is interconnected by two NAND gates 75 and 76. An input terminal of the NAND gate 76 connects to another output terminal of the OR gate 72. In an embodiment, an input terminal of the NAND gate 75 connects to a system voltage terminal 78 or a constant voltage. The system voltage terminal 78 is coupled to an input terminal of the latch 47. The system voltage terminal 78 further connects to a resistor 81 and a capacitor 82. The latch 47 is configured to store a bit status. When the logic circuit 41 determines that the U-phase of the power module has failed, the latch 47 will latch an invalidation message (a high potential) in order to inform the protection circuit 35.

Figure 4:
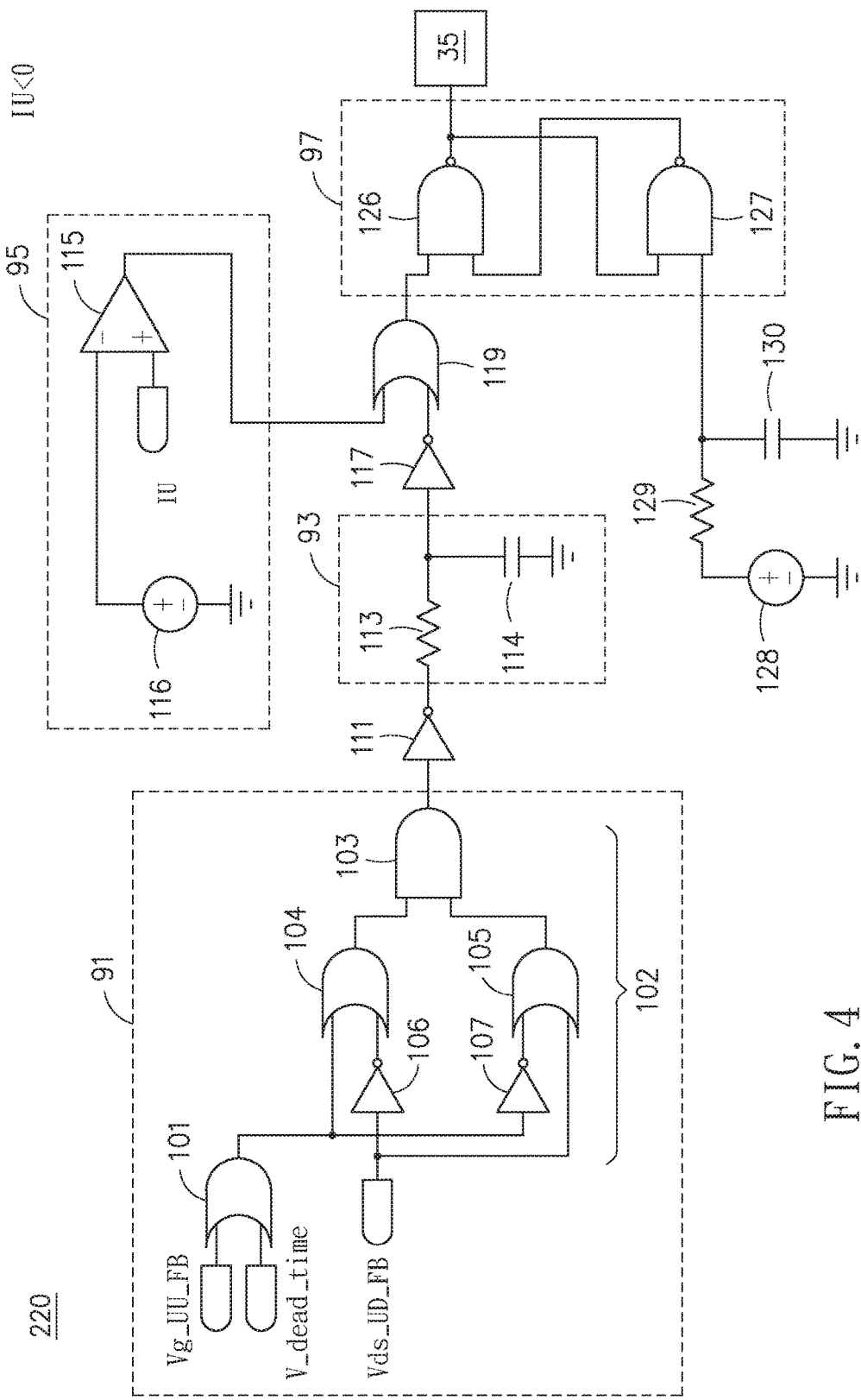
FIG. 4 is a circuit diagram illustrating a diagnosis circuit in accordance with an embodiment of the present disclosure.

FIG. 4 is a circuit diagram illustrating a diagnosis circuit 220 in accordance with an embodiment of the present disclosure. The U-phase, V-phase, and W-phase are respectively equipped with one diagnosis circuit 220 and the operating timing of the diagnosis circuit 220 at each of the three phases (phase currents IU, IV, or IW) is the timing that a corresponding phase current of the phase is less than zero. In an embodiment of the U-phase, the diagnosis circuit 220 is arranged on the U-phase (the combination of the power switches Q1 and Q2). When the phase current IU of the U-phase is less than zero, the diagnosis circuit 220 will operate. In addition, the diagnosis circuit 210 will rest. The diagnosis circuit 220 comprises: a logic circuit 91, wherein the logic circuit 91 comprises a set having a gate voltage Vg_UU_FB terminal of an arm (an up arm, the power switch Q1 in FIG. 1) of a phase (the U-phase) logical OR the dead time voltage V_dead_time terminal, and the set logical exclusive-OR (XOR) the drain-source voltage Vds_UD_FB terminal of another arm (a down arm, the power switch Q2 in FIG. 1) of the phase (the U-phase); a filter circuit 93 coupled to the logic circuit 91, wherein the filter circuit 93 is configured to filter transient noises; a comparison circuit 95 coupled to the filter circuit 93, wherein the comparison circuit 95 is configured to determine whether the phase current IU of the phase current IU terminal of the phase (the U-phase) is greater than zero; and a latch 97 coupled to the comparison circuit 95, wherein the latch 97 is configured to store diagnosis signals temporarily. The gate voltage Vg_UU_FB (FIG. 4) is derived from the gate voltage Vg_UU (FIG. 1) by dropping the gate voltage Vg_UU. The drain-source voltage Vds_UD_FB (FIG. 3) is derived from the drain-source voltage Vds_UD (FIG. 1) by dropping the drain-source voltage Vds_UD.

In an embodiment, the logic circuit 91 comprises an OR gate 101, wherein an input terminal of the OR gate 101 is coupled to the gate voltage Vg_UU_FB terminal (the up arm). The gate voltage Vg_UU_FB is derived from the gate voltage Vg_UU. Another input terminal of the OR gate 101 connects to the dead time voltage V_dead_time terminal. In an embodiment, the logic circuit 91 comprises a XOR gate 102, wherein an input terminal of the XOR gate 102 connects to an output terminal of the OR gate 101, and another input terminal of the XOR gate 102 connects to the drain-source voltage Vds_UD_FB terminal. The XOR gate 102 is composed of an AND gate 103, two OR gates 104 and 105, and two diodes 106 and 107.

In an embodiment, a diode 111 is located between the logic circuit 91 and the filter circuit 93. An anode of the diode 111 connects to an output terminal of the logic circuit 91, and a cathode of the diode 111 connects to an input terminal of the filter circuit 93.

In an embodiment, the filter circuit 93 comprises a resistor 113; and a capacitor 114, wherein an end of the capacitor 114 is grounded, another end of the capacitor 114 connects to the resistor 113. The filter circuit 93 is configured to filter transient noises.

In an embodiment, the comparison circuit 95 comprises an operational amplifier 115. A non-inverting input terminal V+ of the operational amplifier 115 connects to the phase current IU terminal. An inverting input terminal V− of the operational amplifier 115 connects to a system voltage terminal 116 or a constant voltage. The comparison circuit 95 is configured to decide whether the diagnosis circuit 220 shall work or not. When the phase current IU is less than zero, the diagnosis circuit 220 will work. On the contrary, when the phase current IU is greater than zero, the diagnosis circuit 220 will rest.

In an embodiment, the diagnosis circuit 220 comprises a diode 117. The diode 117 is located between an OR gate 119 and the filter circuit 93. An anode of the diode 117 connects to an output terminal of the filter circuit 93, and a cathode of the diode 117 connects to an input terminal of the OR gate 119.

In an embodiment, the diagnosis circuit 220 comprises an OR gate 119, wherein an input terminal of the OR gate 119 connects to an output terminal of the comparison circuit 95 (that is, an output terminal of the operational amplifier 115). Another input terminal of the OR gate 119 is coupled to an output terminal of the filter circuit 93, and an output terminal of the OR gate 119 connects to the latch 97.

In an embodiment, the diagnosis circuit 220 comprises the latch 97. The latch 97 is interconnected by two NAND gates 126 and 127. An input terminal of the NAND gate 126 connects to another output terminal of the OR gate 119. In an embodiment, an input terminal of the NAND gate 127 connects to a system voltage terminal 128 or a constant voltage. The system voltage terminal 128 is coupled to an input terminal of the latch 97. The system voltage terminal 128 further connects to a resistor 129 and a capacitor 130. The latch 97 is configured to store a bit status. When the logic circuit 91 determines that the U-phase of the power module has failed, the latch 97 will latch an invalidation message (a high potential) in order to inform the protection circuit 35.

Figure 5:
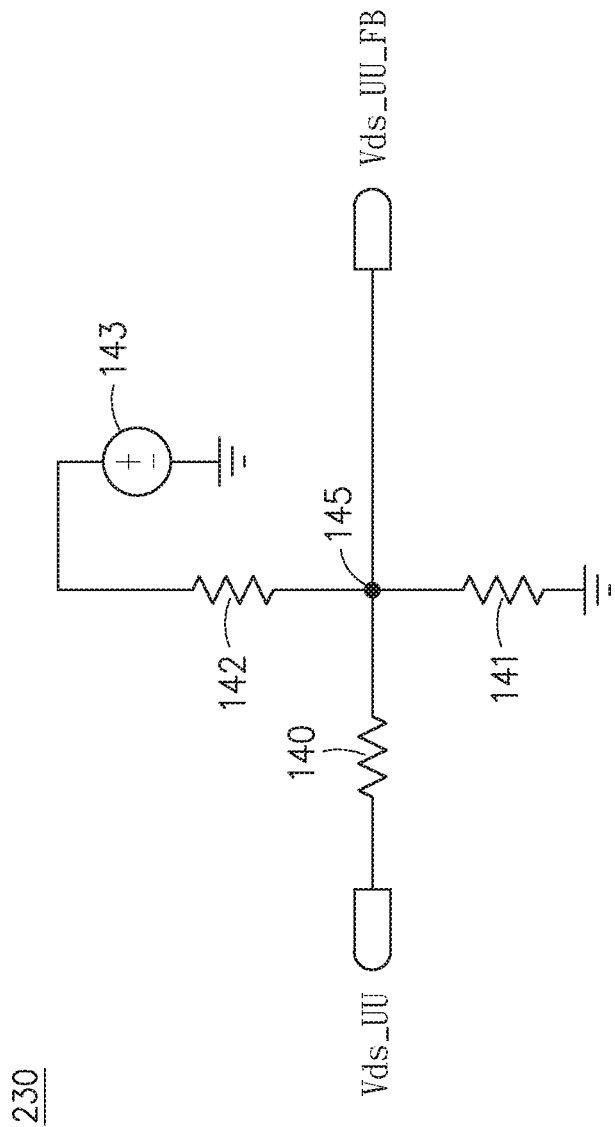
FIG. 5 is a circuit diagram illustrating a voltage divider circuit in accordance with an embodiment of the present disclosure.

FIG. 5 is a circuit diagram illustrating a voltage divider circuit 230 in accordance with an embodiment of the present disclosure. The voltage divider circuit 230 is a part of the diagnosis circuit 210. The voltage divider circuit 230 is configured to reduce voltage signals or voltage values coming from the power module 100. Thus, the voltage signals are compatible with that of logic circuits. In an embodiment, the voltage divider circuit 230 comprises resistors 140, 141, and 142, a system voltage 143 or a constant voltage. The resistors 140, 141, and 142 connect to a node 145. An end of the resistor 140 connects to the drain-source voltage Vds_UU terminal (corresponding to the power switch Q1 in the up arm of the U-phase, FIG. 1). The other end of resistor 140 connects to the node 145, and the resistance of the resistor 140 is 40 kΩ. An end of the resistor 141 is grounded, and the other end connects to the node 145. The resistance of the resistor 141 is 500Ω. An end of the resistor 142 connects to the node 145, and the other end connects to the system voltage 143. The resistance of the resistor 142 is 5 kΩ. The drain-source voltage Vds_UU_FB outputs from the node 145 (corresponding to an input of the logic circuit 41 in FIG. 3).

Figure 6:
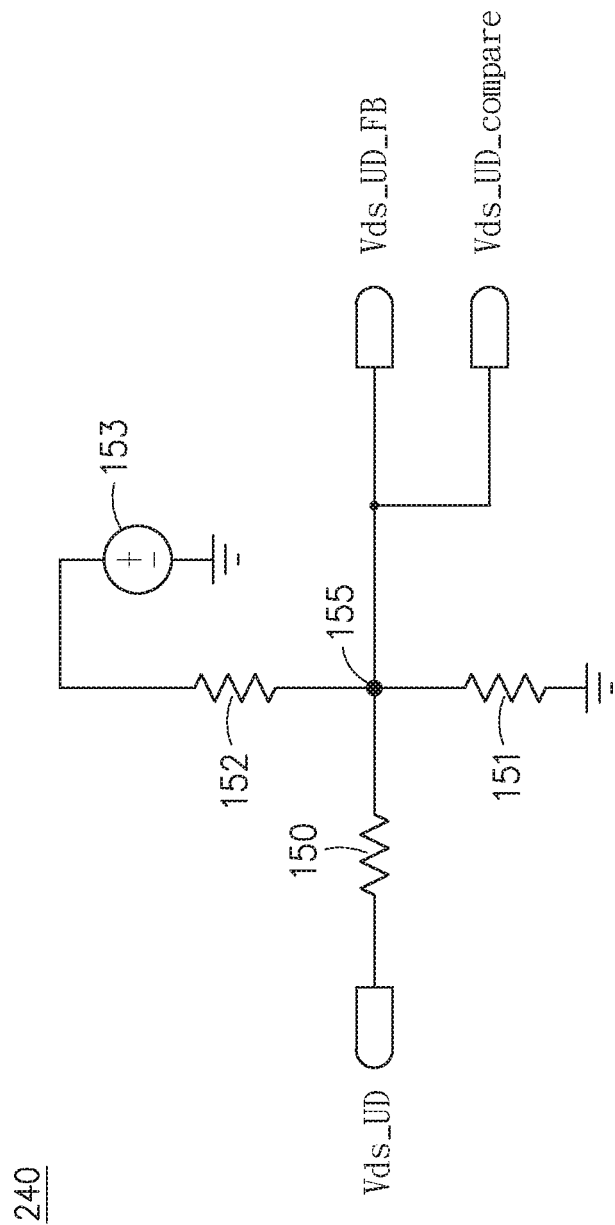
FIG. 6 is a circuit diagram illustrating a voltage divider circuit in accordance with an embodiment of the present disclosure.

FIG. 6 is a circuit diagram illustrating a voltage divider circuit 240 in accordance with an embodiment of the present disclosure. The voltage divider circuit 240 is a part of the diagnosis circuit 220. The voltage divider circuit 240 is configured to reduce voltage signals or voltage values coming from the power module 100. Thus, the voltage signals are compatible with that of logic circuits. In an embodiment, the voltage divider circuit 240 comprises resistors 150, 151, and 152, a system voltage 153 or a constant voltage. The resistors 150, 151, and 152 connect to a node 155. An end of the resistor 150 connects to a drain-source voltage Vds_UD terminal (corresponding to the power switch Q2 in the down arm of the U-phase, FIG. 1). The other end of the resistor 150 connects to the node 155, and the resistance of the resistor 150 is 40 kΩ. An end of the resistor 151 is grounded, and the other end connects to the node 155. The resistance of the resistor 151 is 500Ω. An end of the resistor 152 connects to the node 155, and the other end connects to the system voltage 153. The resistance of the resistor 152 is 1 kΩ. The drain-source voltage Vds_UD_FB (corresponding to an input of the logic circuit 91 in FIG. 4) and a drain-source-compare voltage Vds_UD_FB_compare output from the node 155.

Figure 7:
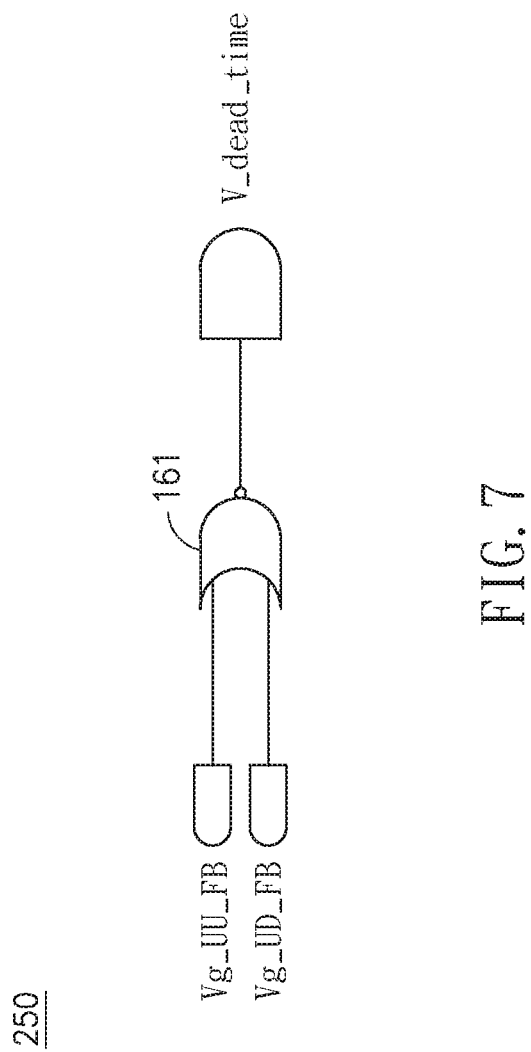
FIG. 7 is a circuit diagram illustrating a dead time circuit in accordance with an embodiment of the present disclosure.

FIG. 7 is a circuit diagram illustrating a dead time circuit 250 in accordance with an embodiment of the present disclosure. The dead time circuit 250 is a part of the diagnosis circuit 210 or the diagnosis circuit 220. The dead time circuit 250 is configured to capture the blank time (also called as the dead time) between the gate voltage Vg_UU of the up arm and the gate voltage Vg_UD of the down arm. In an embodiment, the dead time circuit 250 comprises a NOR gate 161, and an input terminal of the NOR gate 161 connects to the gate voltage Vg_UU_FB terminal, and another input terminal of the NOR gate 161 connects to a gate voltage Vg_UD_FB terminal of another arm (the down arm) of the phase (the U-phase), and an output terminal of the NOR gate 161 is equivalent to the dead time voltage V_dead_time terminal. The dead time voltage V_dead_time terminal respectively corresponds to an input terminal of the diagnosis circuit 210 (FIG. 3) or an input terminal of the diagnosis circuit 220 (FIG. 4). The gate voltage Vg_UU_FB is derived from the gate voltage Vg_UU (FIG. 1). The gate voltage Vg_UD_FB is derived from the drain-source voltage Vg_UD (FIG. 1).

Figure 8:
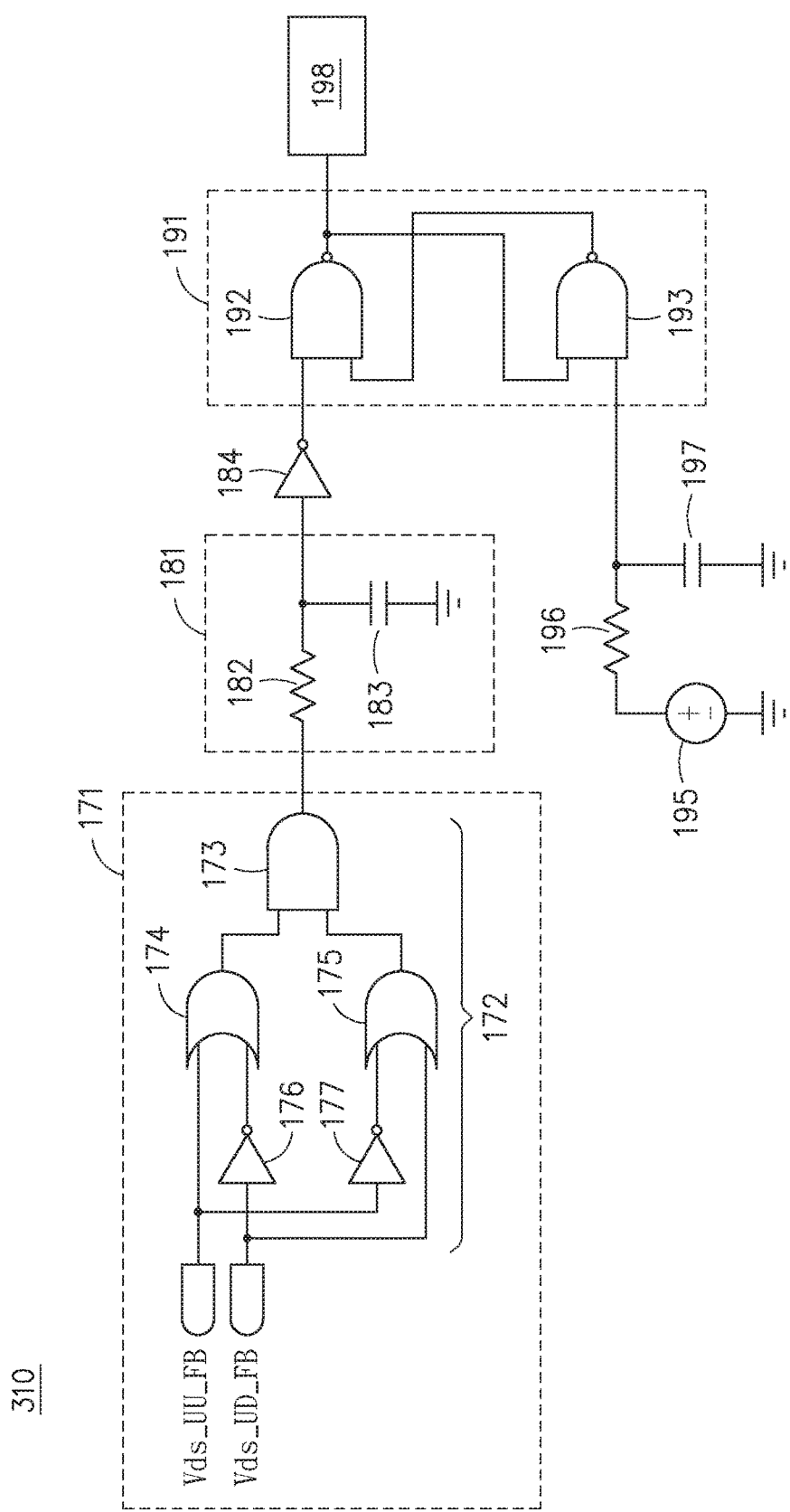
FIG. 8 is a circuit diagram illustrating a diagnosis circuit in accordance with an embodiment of the present disclosure.

FIG. 8 is a circuit diagram illustrating a diagnosis circuit 310 in accordance with an embodiment of the present disclosure. The diagnosis circuit 310 is adapted to quickly diagnose whether a power module fails. In particular, the diagnosis circuit 310 is useful when an arm (assuming an up arm) of a phase is normal and another arm (assuming a down arm) of the same phase fails. The diagnosis circuit 310 may quickly realize that the down arm has been disabled. Later, the diagnosis circuit 310 may activate a protection procedure for the power module. In order to know the failure of the power module, there is no need to wait for the complete detection of all six arms of three phases for saving the diagnosis time. In practice, the U-phase, V-phase, and W-phase are respectively equipped with one diagnosis circuit 310. In an embodiment, the diagnosis circuit 310 is equipped on the U-phase (the combination of the power switches Q1 and Q2 in FIG. 1). The diagnosis circuit 310 comprises: a logic circuit 171, wherein a drain-source voltage Vds_UU_FB terminal of an arm (an up arm) of a phase (the U-phase) logical XOR a drain-source voltage Vds_UD_FB terminal of another arm (a down arm) of the phase (the U-phase); a filter circuit 181 coupled to the logic circuit 171, wherein the filter circuit 181 is configured to filter transient noises; and a latch 191 coupled to the filter circuit 181, wherein the latch 191 is configured to store diagnosis signals temporarily.

In an embodiment, the logic circuit 171 comprises a XOR gate 172. An input terminal of the XOR gate 172 connects to the drain-source voltage Vds_UU_FB terminal of the arm (the up arm) of the phase (the U-phase), and another input terminal of the XOR gate 172 connects to the drain-source voltage Vds_UD_FB terminal of another arm (the down arm) of the phase (the U-phase). The XOR gate 172 is composed of an AND gate 173, two OR gates 174 and 175, and two diodes 176 and 177. The drain-source voltage Vds_UU_FB is derived from the drain-source voltage Vds_UU (FIG. 1) by dropping the drain-source voltage Vds_UU. The drain-source voltage Vds_UD_FB is derived from the drain-source voltage Vds_UD (FIG. 1) by dropping the drain-source voltage Vds_UD.

In an embodiment, the filter circuit 181 comprises a resistor 182; and a capacitor 183. An end of the capacitor 183 is grounded, another end of the capacitor 183 connects to the resistor 182.

In an embodiment, the diagnosis circuit 310 comprises a diode 184. The diode 184 is located between the filter circuit 181 and the latch 191. An anode of the diode 184 connects to an output terminal of the filter circuit 181, and a cathode of the diode 184 connects to an input terminal of the latch 191.

In an embodiment, the diagnosis circuit 220 comprises the latch 191. The latch 191 is interconnected by two NAND gates 192 and 193. An input terminal of the NAND gate 192 connects to the cathode of the diode 184. An input terminal of the NAND gate 193 connects to a system voltage terminal 195 or a constant voltage. The system voltage terminal 195 is coupled to an input terminal of the latch 191. The system voltage terminal 195 further connects to a resistor 196 and a capacitor 197.

The latch 191 is configured to store a bit status. When the logic circuit 171 determines that the U-phase of the power module has failed, the latch 191 will latch an invalidation message (a high potential) in order to inform a protection circuit 198.

Figure 9:
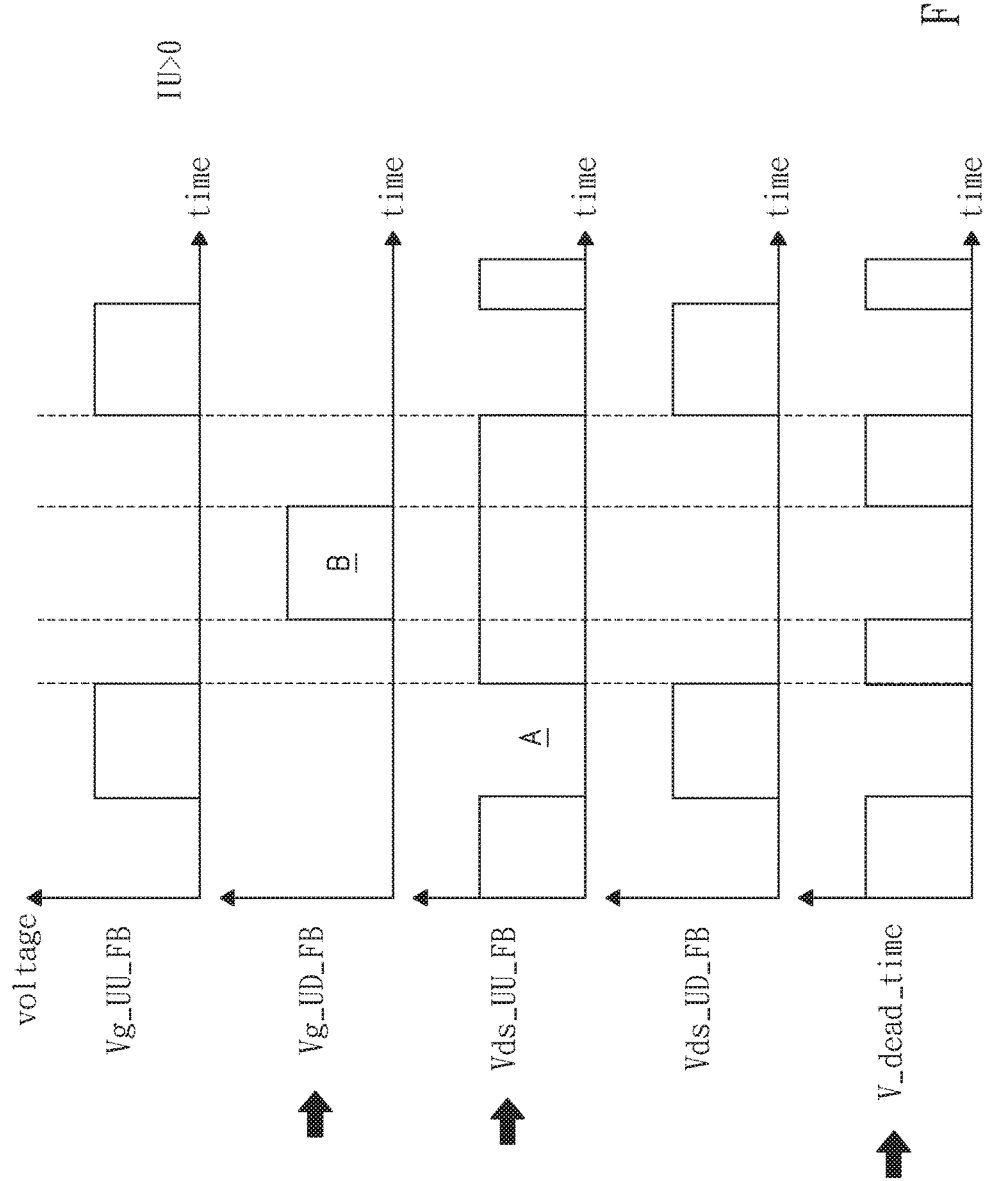
FIG. 9 is a waveform graph illustrating the diagnosis circuit of FIG. 3 in accordance with an embodiment of the present disclosure.

FIG. 9 is a waveform graph illustrating the diagnosis circuit 210 in accordance with an embodiment of the present disclosure. Signals in the diagnosis circuit 210 are classified to a high potential signal and a low potential signal for judgment. Therefore, the waveform is a square wave, wherein the high potential signal represents 1 or true, and the low potential signal represents 0 or false. When the phase current IU of the U-phase is greater than zero, the diagnosis circuit 210 will operate. There is a dead time voltage V_dead_time (also called as the blank time) between the gate voltage Vg_UU_FB of the up arm and the gate voltage Vg_UD_FB of the down arm. The dead time voltage V_dead_time is retrieved by the dead time circuit 250. The dead time is referred to as an interval when both gate terminals of the up arm and the down arm turn off. The gate voltage Vg_UU_FB of the up arm of the U-phase and the drain-source voltage Vds_UU_FB of the up arm of the U-phase are in reverse phase, which is a characteristic of power switches. If one terminal is at a high potential, the other one will be at a low potential. The gate voltage Vg_UD_FB of the down arm of the U-phase and the drain-source voltage Vds_UD_FB of the down arm of the U-phase are in reverse phase.

In an embodiment, a truth table of the diagnosis circuit 210 is shown as follows.

| gate voltage Vg_UD_FB logical OR dead time voltage V_dead_time | drain-source voltage Vds_UU_FB | XOR |
|---|---|---|
| 0 | 0 | 0 (normal, such as a A-section in FIG. 9) |
| 0 | 1 | 1 (abnormal) |
| 1 | 0 | 1 (abnormal) |
| 1 | 1 | 0 (normal, such as a B-section in FIG. 9) |

Referring to FIG. 9, it emphasizes on waveforms of the gate voltage Vg_UD_FB, the dead time voltage V_dead_time, and the drain-source voltage Vds_UU_FB. Under a normal state of the power module 100, there is a set having a gate voltage Vg_UD_FB of the down arm logical OR the dead time voltage V_dead_time. Further, the set and the drain-source voltage Vds_UU_FB of the up arm are in phase. There are two normal states in the above truth table such as the A-section and the B-section in FIG. 9. In the A-section, it represents a set having the gate voltage Vg_UD_FB (at 0 or at a low potential) logical OR the dead time voltage V_dead_time (at 0 or at a low potential). This set brings out a zero truth value or is at a low potential. Further, a truth value that the set exclusive-OR the drain-source voltage Vds_UU_FB (at 0 or at a low potential) is zero. Therefore, the A-section brings out a zero truth value or is at a low potential. When the in phase characteristic {(Vg_UD_FB OR V_dead_time) XOR Vds_UU_FB} is broken, the power module 100 is diagnosed with an abnormal state by the diagnosis circuit 210, such as the abnormal states in the above truth table.

Figure 10:
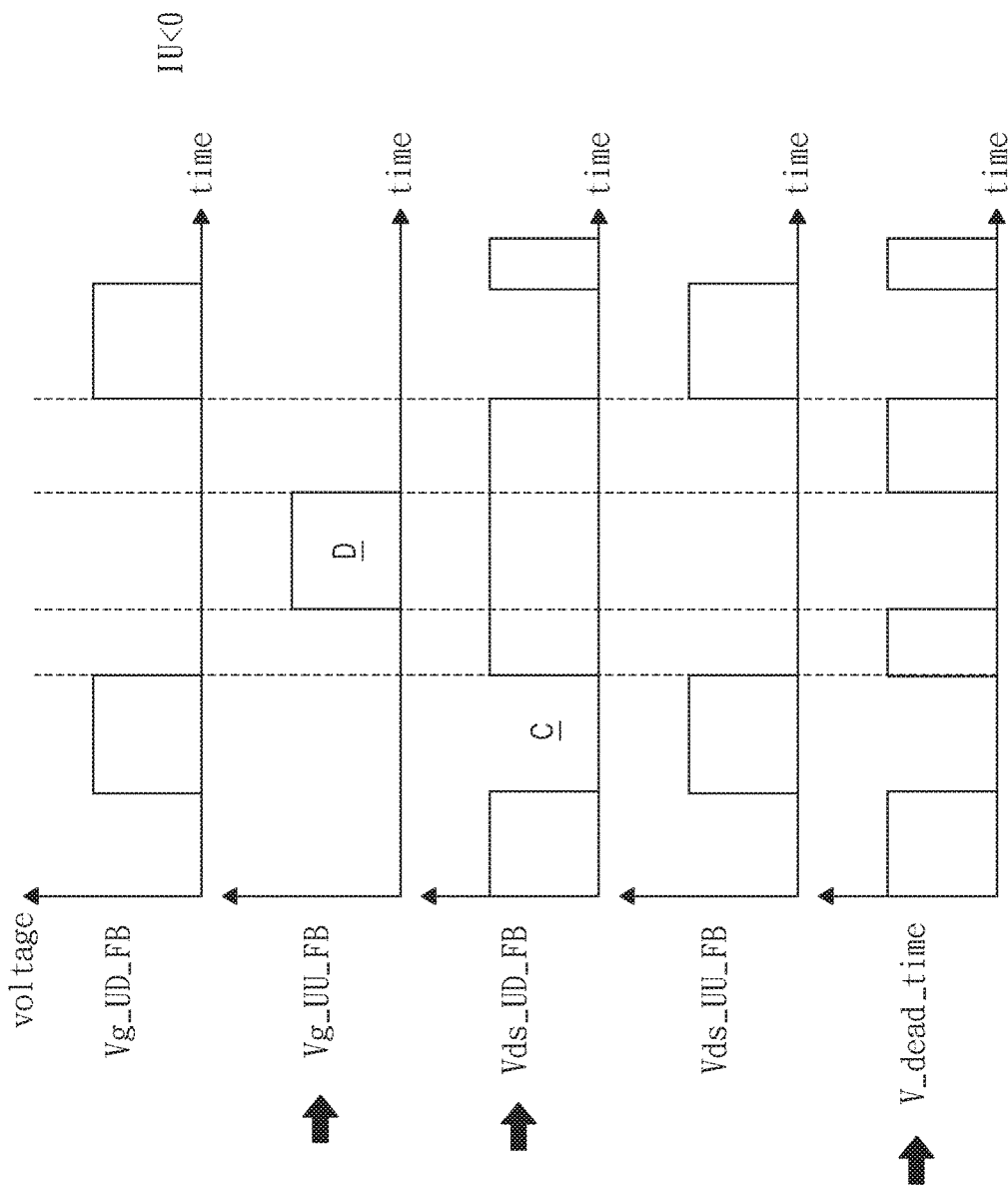
FIG. 10 is a waveform graph illustrating the diagnosis circuit of FIG. 4 in accordance with an embodiment of the present disclosure.

FIG. 10 is a waveform graph illustrating the diagnosis circuit 220 in accordance with an embodiment of the present disclosure. When the phase current IU is less than zero, the diagnosis circuit 220 will work. A truth table of the diagnosis circuit 220 is shown as follows.

| gate voltage Vg_UU_FB logical OR dead time voltage V_dead_time | drain-source voltage Vds_UD_FB | XOR |
|---|---|---|
| 0 | 0 | 0 (normal, such as a C-section in FIG. 10) |
| 0 | 1 | 1 (abnormal) |
| 1 | 0 | 1 (abnormal) |
| 1 | 1 | 0 (normal, such as a D-section in FIG. 10) |

Referring to FIG. 10, it respectively shows waveforms of the gate voltage Vg_UU_FB, the dead time voltage V_dead_time, and the drain-source voltage Vds_UD_FB. Under a normal state of the power module 100, there is a set having a gate voltage Vg_UU_FB of the up arm logical OR the dead time voltage V_dead_time. Further, the set and the drain-source voltage Vds_UD_FB of the down arm are in phase. There are two normal states in the above truth table such as the C-section and the D-section in FIG. 10. In the D-section, it represents a set having the gate voltage Vg_UU_FB (at 1 or at a high potential) logical OR the dead time voltage V_dead_time (at 0 or at a low potential). This set brings out a one-truth-value or is at a high potential. Further, a truth value that the set exclusive-OR the drain-source voltage Vds_UD_FB (at 1 or at a high potential) is zero. Therefore, the D-section brings out a zero truth value or is at a low potential, which is at a normal state. When the in phase characteristic {(Vg_UU_FB OR V_dead_time) XOR Vds_UD_FB} is broken, the power module 100 is diagnosed with an abnormal state by the diagnosis circuit 220, such as the abnormal states in the above truth table. The diagnosis circuits 210 and 220 utilize the complete in phase characteristic combined with the judgment of the logic circuits. When the complete in phase characteristic is broken, it represents that the power module 100 is at an abnormal state. The abnormal state may be caused by a short circuit or an open circuit of the up arms or the down arms.

Figure 11:
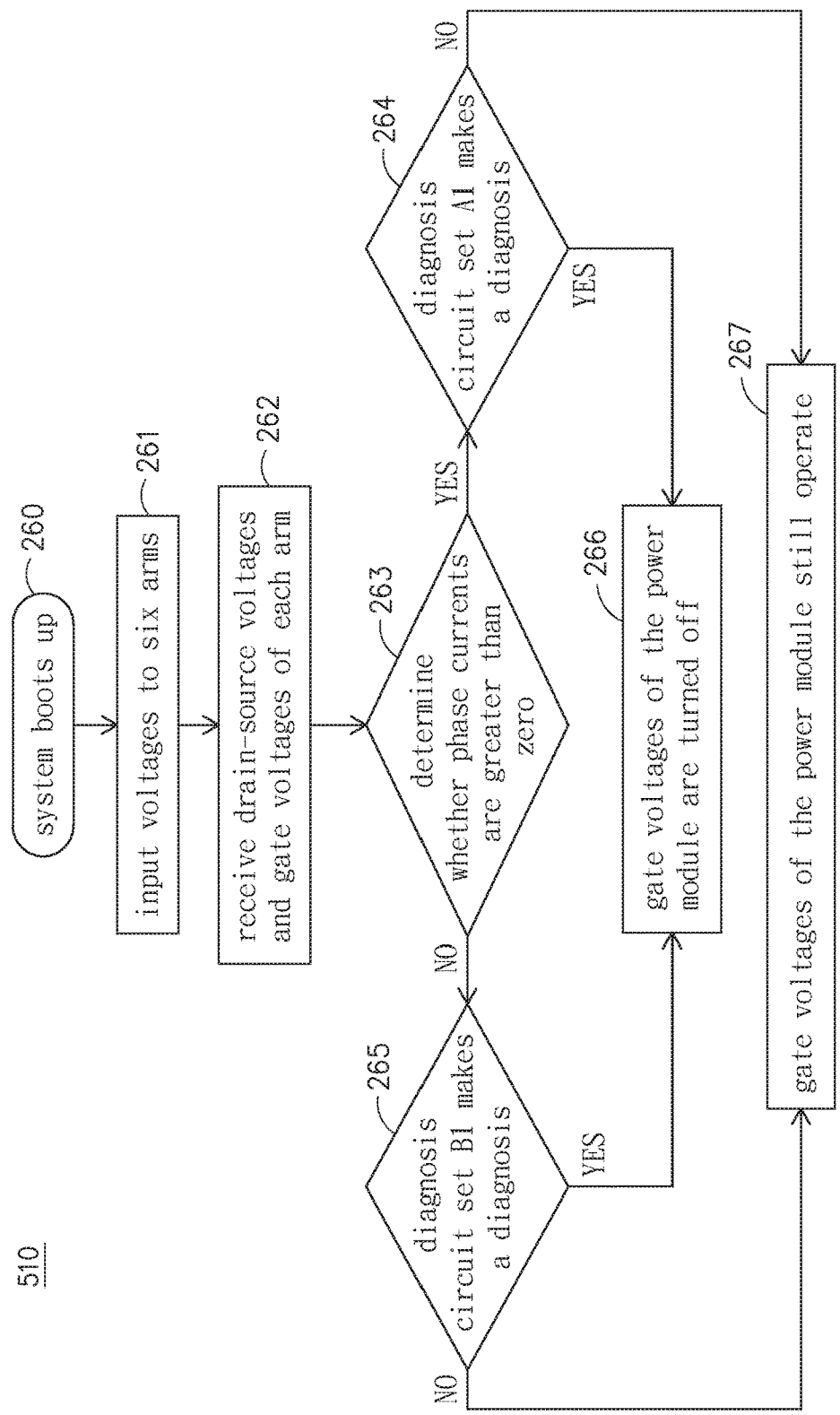
FIG. 11 is a flow chart illustrating a diagnosis method in accordance with an embodiment of the present disclosure.

FIG. 11 is a flow chart illustrating a diagnosis method 510 in accordance with an embodiment of the present disclosure. The diagnosis method 510 comprises: inputting a voltage to six arms corresponding to the power switches Q1-Q6 (step 261); receiving a drain-source voltage (Vds_UU_FB or Vds_UD_FB) and a gate voltage (Vg_UU_FB or Vg_UD_FB) of each arm of the six arms (step 262); receiving a phase current (phase current IU, IV, or IW) of each phase of three phases (U-phase, V-phase, and W-phase) of the six arms (step 263); determining whether the phase current is greater than zero (step 263); and determining a set having the gate voltage (assume Vg_UU_FB) of one of the arms (the up arm) of the phase (the U-phase) logical OR a dead time voltage (V_dead_time) (step 264), and determining whether the set and the drain-source voltage (Vds_UD_FB) of another arm (the down arm) of the phase (the U-phase) are in phase (step 265).

In a step 260, a system boots up.

In a step 261, at the initial time, each arm of the six arms (corresponding to the power switches Q1-Q6, respectively) of the power module 100 is provided with an initial voltage value.

In a step 262, during the power outputting process of the power module 100, a gate voltage and a drain-source voltage of each arm of the power module 100 are fed back. For example, the gate voltages (Vg_UU_FB or Vg_UD_FB) of an up arm or down arm and the drain-source voltages (Vds_UU_FB or Vds_UD_FB) of the up arm or down arm are fed back.

In a step 263, each of the phase currents IU, IV, and IW captured by the current transducers 25, 26, and 27, respectively, is fed back. When the phase current is greater than zero, the procedure goes to a step 264. In the step 264, the gate voltages of the down arm, the drain-source voltages of the up arm and the dead time voltage are fed back to a diagnosis circuit set A1. Further, the diagnosis circuit set A1 makes a diagnosis on the power module 100. The diagnostic circuit set A1 is a set composed of each diagnosis circuit 210 of each of the three phases (U-phase, V-phase, and W-phase).

In the step 263, when the phase current is less than zero, the procedure goes to a step 265. In the step 265, the gate voltages of the up arm, the drain-source voltages of the down arm, and the dead time voltage are fed back to a diagnosis circuit set B1. Further, the diagnosis circuit set B1 makes a diagnosis on the power module 100. The diagnostic circuit set B1 is a set composed of each diagnosis circuit 220 of each of the three phases (U-phase, V-phase, and W-phase).

In a step 266, if the power module 100 is open or short abnormally, the diagnostic circuit set A1 or B1 outputs a high-level voltage (a high potential or 1). In addition, the gate voltages of the six arms of the power module 100 are turned off so as to prevent the power module 100 from damage and being at a failure state for a long time.

In a step 267, the power module 100 does not fail so that of the power module 100 still operate and outputs the gate voltages of the six arms.

The present disclosure provides a diagnosis circuit and a diagnosis method for a power module. By using feedback signals of the gate voltages and the drain-source voltages of each arm, a set of the gate voltages logical OR the dead time voltages is determined. Further, the diagnosis circuit determines whether the set and the drain-source voltages are in phase or not. By using the in phase feature, a normal state or an open or short circuit of the power switches is recognized. After the power module fails, the power module is quickly shut down so as to avoid a long failure time. If the failure time is too long, the variable frequency controller may be damaged seriously. The diagnosis circuit and the diagnosis method of the present disclosure are capable of fast diagnosis, on-line detection, and open or short circuit diagnosis. There is no need to equip additional current transducers so that the diagnosis circuit has a low cost.

It will be apparent to those skilled in the art that various modifications and variations can be made to the disclosed embodiments. It is intended that the specification and examples be considered as exemplary embodiments only, with a scope of the disclosure being indicated by the following claims and their equivalents.

| | |
|---|---|
| 20 battery | 22 capacitor |
| Q1-Q6 power switch | D1-D6 diode |
| R1-R6 resistor | Vg_UU gate voltage |
| Vg_UD gate voltage | Vds_UD drain-source voltage |
| Vds_UU drain-source voltage | 25、26、27 current transducer |
| IU、IV、IW phase current | 31、32、33 step |
| L1-L3 inductor | 41 logic circuit |
| 35 protection circuit | 45 comparison circuit |
| 43 filter circuit | 51 OR gate |
| 47 latch | 53 AND gate |
| 52 XOR gate | 55 OR gate |
| 54 OR gate | 57 diode |
| 56 diode | 62 resistor |
| 61 diode | 65 operational amplifier |
| 63 capacitor | 71 diode |
| 66 system voltage terminal | 75 NAND gate |
| 72 OR gate | 78 system voltage terminal |
| 76 NAND gate | Vds_UU_FB drain-source voltage |
| 81 resistor | 82 capacitor |
| Vds_UD_FB drain-source voltage | V_dead_time dead time voltage |
| Vg_UU_FB gate voltage | Vg_UD_FB gate voltage |
| 91 logic circuit | 93 filter circuit |
| 95 comparison circuit | 97 latch |
| 101 OR gate | 102 XOR gate |
| 103 AND gate | 104 OR gate |
| 105 OR gate | 106 diode |
| 107 diode | 111 diode |
| 113 resistor | 114 capacitor |
| 115 operational amplifier | 116 system voltage terminal |
| 117 diode | 119 OR gate |
| 126 NAND gate | 127 NAND gate |
| 128 system voltage terminal | 129 resistor |
| 130 capacitor | A1、B1 diagnosis circuit set |
| | 141 resistor |
| 140 resistor | 143 system voltage |
| 142 resistor | 150 resistor |
| 145 node | 152 resistor |
| 151 resistor | 155 node |
| 153 system voltage | 161 NOR gate |
| Vds_UD_compare drain-source voltage | 172 XOR gate |
| 171 logic circuit | 174 OR gate |
| 173 AND gate | 176 diode |
| 175 OR gate | 181 filter circuit |
| 177 diode | 183 capacitor |
| 182 resistor | 191 latch |
| 184 diode | 193 NAND gate |
| 192 NAND gate | 196 resistor |
| 195 system voltage terminal | 198 protection circuit |
| 197 capacitor | 200 diagnosis circuit |
| 100 power module | 220 diagnosis circuit |
| 210 diagnosis circuit | 240 voltage divider circuit |
| 230 voltage divider circuit | 310 diagnosis circuit |
| 250 dead time circuit | A、B、C、D time |
| 260、261、262、263、264、265、266、267 step | |

What is claimed is:

1. A diagnosis circuit for a power module, the power module comprising three phases of six arms, each phase having an up arm and a down arm, each arm having a power switch, the diagnosis circuit comprising:
    a logic circuit, wherein the logic circuit comprises a set having a gate voltage terminal of one arm of one phase logical OR a dead time voltage terminal, and the set logical XOR a drain-source voltage terminal of the other arm of said one phase, the dead time voltage terminal corresponding to a blank time between the gate voltage terminal of said one arm of said one phase and a gate voltage terminal of said the other arm of said one phase;
    a filter circuit coupled to the logic circuit, wherein the filter circuit is configured to filter transient noises;
    a comparison circuit coupled to the filter circuit, wherein the comparison circuit connects to a first system voltage terminal and a phase current terminal of said one phase, and is configured to determine whether a phase current of the phase current terminal of said one phase is greater than zero; and
    a latch coupled to the comparison circuit, wherein the latch is configured to store diagnosis signals temporarily, the diagnosis signals being generated according to a judgment based on output signals of the logic circuit, the filter circuit and the comparison circuit in order to diagnose whether the power module is in a normal state.

2. The diagnosis circuit for a power module according to claim 1, wherein the logic circuit comprises:
    an OR gate, wherein an input terminal of the OR gate is coupled to the gate voltage terminal of said one arm of said one phase, and another input terminal of the OR gate connects to the dead time voltage terminal.

3. The diagnosis circuit for a power module according to claim 2, wherein the logic circuit comprises:
    a XOR gate, wherein an input terminal of the XOR gate connects to an output terminal of the OR gate, and another input terminal of the XOR gate connects to the drain-source voltage terminal.

4. The diagnosis circuit for a power module according to claim 1, wherein the filter circuit comprises:
    a resistor; and
    a capacitor, wherein an end of the capacitor is grounded, another end of the capacitor connects to the resistor.

5. The diagnosis circuit for a power module according to claim 1, further comprising:
    a diode located between the logic circuit and the filter circuit, wherein an anode of the diode connects to an output terminal of the logic circuit, and a cathode of the diode connects to an input terminal of the filter circuit.

6. The diagnosis circuit for a power module according to claim 1, wherein the comparison circuit comprises:
    an operational amplifier, wherein an input terminal of the operational amplifier connects to the phase current terminal.

7. The diagnosis circuit for a power module according to claim 6, wherein the input terminal of the operational amplifier is a non-inverting input terminal.

8. The diagnosis circuit for a power module according to claim 6, wherein the input terminal of the operational amplifier is an inverting input terminal.

9. The diagnosis circuit for a power module according to claim 1, further comprising:
    an OR gate, wherein an input terminal of the OR gate connects to an output terminal of the comparison circuit, and another input terminal of the OR gate is coupled to an output terminal of the filter circuit, and an output terminal of the OR gate connects to the latch.

10. The diagnosis circuit for a power module according to claim 9, further comprising:
  a diode located between the OR gate and the comparison circuit, wherein an anode of the diode connects to the output terminal of the comparison circuit, and a cathode of the diode connects to the another input terminal of the OR gate.

11. The diagnosis circuit for a power module according to claim 1, further comprising:
  a voltage divider circuit located between the drain-source voltage terminal and the logic circuit, wherein the voltage divider circuit is configured to reduce a voltage value of the drain-source voltage terminal.

12. The diagnosis circuit for a power module according to claim 1, further comprising:
  a dead time circuit, wherein the dead time circuit comprises a NOR gate, and an input terminal of the NOR gate connects to the gate voltage terminal, and another input terminal of the NOR gate connects to the gate voltage terminal of said the other arm of said one phase, and an output terminal of the NOR gate is the dead time voltage terminal.

13. The diagnosis circuit for a power module according to claim 1, further comprising:
  a second system voltage terminal coupled to an input terminal of the latch.

14. A diagnosis circuit for a power module, the power module comprising three phases of six arms, each phase having an up arm and a down arm, each arm having a power switch, the diagnosis circuit comprising:
  a logic circuit, wherein a drain-source voltage terminal of one arm of one phase logical XOR a drain-source voltage terminal of the other arm of said one phase;
  a filter circuit coupled to the logic circuit, wherein the filter circuit is configured to filter transient noises; and
  a latch coupled to the filter circuit, wherein the latch is configured to store diagnosis signals temporarily, the diagnosis signals being generated according to a judgment based on output signals of the logic circuit and the filter circuit in order to diagnose whether the power module is in a normal state.

15. The diagnosis circuit for a power module according to claim 14, wherein the logic circuit comprises:
  a XOR gate, wherein an input terminal of the XOR gate connects to the drain-source voltage terminal of said one arm of said one phase, and another input terminal of the XOR gate connects to the drain-source voltage terminal of said the other arm of said one phase.

16. The diagnosis circuit for a power module according to claim 14, wherein the filter circuit comprises:
  a resistor; and
  a capacitor, wherein an end of the capacitor is grounded, and another end of the capacitor connects to the resistor.

17. The diagnosis circuit for a power module according to claim 14, further comprising:
  a diode located between the filter circuit and the latch, wherein an anode of the diode connects to an output terminal of the filter circuit, and a cathode of the diode connects to an input terminal of the latch.

18. A diagnosis method for a power module, the power module comprising three phases of six arms, each phase having an up arm and a down arm, each arm having a power switch, the diagnosis method comprising:
  inputting a voltage to the six arms;
  receiving a drain-source voltage and a gate voltage of each arm of the six arms;
  receiving a phase current of each phase of the three phases of the six arms;
  determining whether the phase current is greater than zero with a comparison circuit connecting to a first system voltage terminal and a phase current terminal of a respective phase;
  determining a set having the gate voltage of one arm of the respective phase logical OR a dead time voltage, and whether the set and the drain-source voltage of the other arm of the respective phase are in phase, the dead time voltage terminal corresponding to a blank time between the gate voltage terminal of said one arm of the respective phase and a gate voltage terminal of said the other arm of the respective phase; and
  generating diagnosis signals according to a judgment based on output signals of a logic circuit and the comparison circuit in order to diagnose whether the power module is in a normal state.

19. The diagnosis method for a power module according to claim 18, further comprising:
  turning off the gate voltages of the six arms when the set and the drain-source voltage are not in phase.

20. The diagnosis method for a power module according to claim 18, further comprising:
  when the phase current is greater than zero, the arm being a down arm, and the another arm being an up arm.

21. The diagnosis method for a power module according to claim 18, further comprising:
  when the phase current is less than zero, the arm being an up arm, and the another arm being a down arm.

* * * * *